(12) United States Patent  
Gao

(10) Patent No.: US 8,731,011 B2
(45) Date of Patent: May 20, 2014

(54) PRECISION OPTICAL FREQUENCY TUNABLE LASER

(71) Applicant: GP Photonics Inc., Tianjin (CN)

(72) Inventor: Peiliang Gao, Tianjin (CN)

(73) Assignee: GP Photonics Inc., Tianjin (CN)

( * ) Notice: Subject to any disclaimer, the term of this patent is extended or adjusted under 35 U.S.C. 154(b) by 0 days.

(21) Appl. No.: 13/974,741

(22) Filed: Aug. 23, 2013

(65) Prior Publication Data

US 2014/0010250 A1   Jan. 9, 2014

Related U.S. Application Data

(63) Continuation of application No. PCT/CN2011/077124, filed on Jul. 14, 2011.

(51) Int. Cl.
*H01S 3/10* (2006.01)
(52) U.S. Cl.
USPC .................. 372/20; 372/27; 372/28; 372/29; 372/32; 372/69; 372/99
(58) Field of Classification Search
USPC .................................... 372/20, 27–29, 32, 69
See application file for complete search history.

(56) References Cited

U.S. PATENT DOCUMENTS

| 5,724,373 A * | 3/1998 | Chang | 372/20 |
| 6,539,041 B1 * | 3/2003 | Scheps | 372/53 |
| 8,369,367 B1 * | 2/2013 | Gao | 372/13 |

* cited by examiner

*Primary Examiner* — Dung Nguyen
(74) *Attorney, Agent, or Firm* — Omair M. Farooqui

(57) ABSTRACT

The invention relates to a precision optical frequency tunable laser. The laser includes: a laser gain medium, an intracavity collimating lens, an active optical phase modulator, a tunable acousto-optic filter and an intracavity total reflection mirror all arranged sequentially in a laser cavity, and the tunable laser further includes an active polarization rotator, a polarization beam splitter, two etalons, a temperature control system attached to the etalons, two total reflection mirrors, a radio frequency signal source, a laser pumping source, an active optical phase modulator drive source, an active polarization rotator drive source and a laser drive control circuit. Through the temperature control system attached to the etalons, stable laser output and the precision optical frequency tuning less than 1 GHz within a wide spectrum range can be realized, thereby greatly reducing the bandwidth requirements in achieving narrowband filtering for the tunable acousto-optic filter. The invention is compact with high performance, low cost for volume production and installation, and achieves stable tunable laser output within a wide spectrum range.

18 Claims, 10 Drawing Sheets

PRECISION OPTICAL FREQUENCY TUNABLE LASER

CROSS-REFERENCE TO RELATED APPLICATION

The application is a continuation of PCT/CN2011/077124 (filed on Jul. 14, 2011), which claims priority of Chinese patent application 201110193688.6 (filed on Jul. 12, 2011), the contents of which are incorporated herein by reference, as if fully set forth herein.

FIELD OF THE INVENTION

The invention belongs to the field of photonics, and in particular relates to a precision optical frequency tunable laser.

BACKGROUND OF THE INVENTION

There are typically three tuning technologies used in an external cavity tunable laser: 1) tuning is achieved by using a precision stepping motor to drive a grating to rotate, and this technology has the following shortcomings: first, there are quite high requirements on stepping moving precision and repeatability of the stepping motor in achieving precision optical frequency tuning, thus the cost is relatively high; second, the purpose of miniaturization is hardly achieved due to the stepping motor used; and third, the operational stability is poor under a harsh working environment, in particular, resistances to various mechanical vibrations are poor. Because of these problems, the tunable laser using this technology is only suitable for use under a laboratory working environment; 2) tuning is achieved by a tunable acousto-optic filter. This technology has the advantages of high tuning speed, no mechanical moving component and small size. However, it has the shortcomings of low tuning precision and relatively wide filtering bandwidth, therefore, the tunable laser using this technology is only suitable for applications in which both the tuning precision and the output bandwidth are not high; and 3) tuning is based upon the temperature-sensitive characteristics of the transmission optical frequency of grating or other optical filtering devices in laser resonant cavity, such as an optical Etalon. This tuning technology has high tuning precision and relatively narrow spectrum bandwidth, but low tuning speed. Therefore it is not suitable when the wide spectral range tuning is needed, for example: if the temperature coefficient of an optical filtering device is 0.02 nanometers/degree, the desired spectrum range and temperature adjustment range are 20 nanometers and 100 degrees respectively, which is impracticable for some applications.

BRIEF DESCRIPTION OF THE DRAWINGS

FIG. 3-1 is a wave vector relation diagram of the incident light beam, the first diffracted beam, and the acoustic wave field in the acousto-optic crystal;

FIG. 3-2 is a wave vector relation diagram of the incident light beam, the second diffracted beam, and the acoustic wave field in the acousto-optic crystal;

FIG. 9-1 shows the transmission spectrum of the first etalon with 50 GHz interval;

FIG. 9-2 shows the transmission spectrum of the second etalon with 50 GHz interval and 25 GHz difference between the two etalons in transmission spectrum peak frequency;

DETAILED DESCRIPTION OF THE INVENTION

Figure 1:
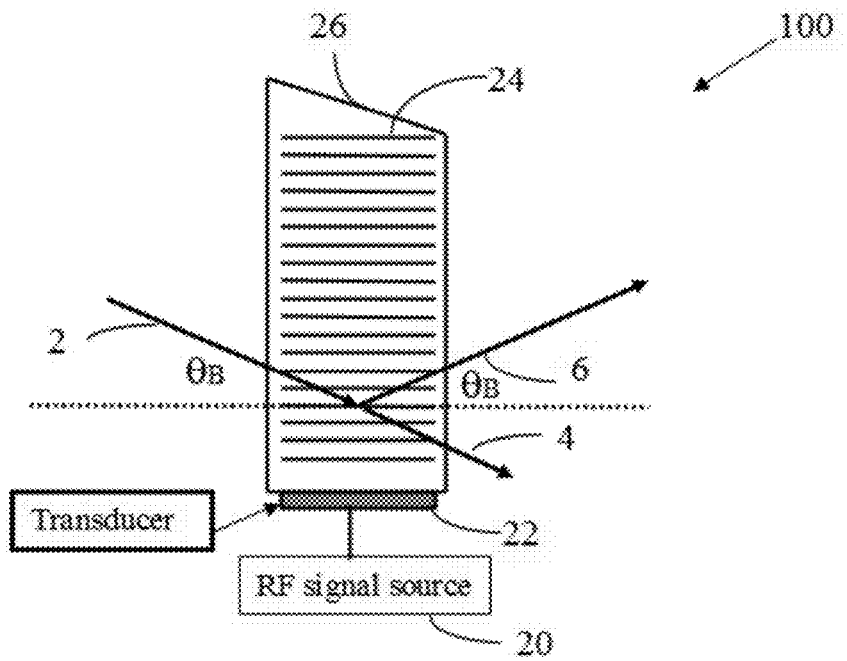
FIG. 1 is a schematic diagram of an existing conventional tunable acousto-optic filter.

It is an objective of the invention to overcome the shortcomings in the prior art and to provide a precision optical frequency tunable laser with stable performance, low cost, small size, easy installation and production.

The technical scheme below is adopted by the invention for solving the technical problems in the prior art.

A precision optical frequency tunable laser comprising a laser gain medium, a laser cavity end mirror arranged on the laser gain medium, an intracavity collimating lens, an active optical phase modulator, a tunable acousto-optic filter and an intracavity total reflection mirror all arranged sequentially inside the laser cavity and in such a way that the light beam emitted from the laser gain medium can be diffracted twice by the tunable acousto-optic filter and the frequency shift introduced by the diffractions can be compensated, the laser further includes:

an active polarization rotator for controlling the polarization direction of linearly polarized incident light, the active polarization rotator is arranged on the opposite side of the tunable acousto-optic filter from the intracavity total reflection mirror to receive the diffracted light beam by the tunable acousto-optic filter;

a polarization beam splitter arranged behind the active polarization rotator for total transmission of parallel polarized incident light and for reflecting vertically polarized incident light into a direction having an angle of 90 degrees with respect to the incident light;

a first etalon and a first total reflection mirror, which are arranged in a direction vertical to the optic axis of the diffracted light beam by the tunable acousto-optic filter and used for receiving the vertically polarized light output by the polarization beam splitter and outputting the vertically polarized light to the first total reflection mirror, the first total reflection mirror and the laser cavity end mirror forming a first laser resonant sub-cavity, and a first temperature control system for adjusting the temperature of the first etalon is arranged on the first etalon;

a second etalon and a second total reflection mirror, which are arranged in a direction parallel to the optic axis of the diffracted light beam by the tunable acousto-optic filter and used for receiving the parallel polarized light output by the polarization beam splitter and outputting the parallel polarized light to the second total reflection mirror, the second total reflection mirror and the laser cavity end mirror forming a second laser resonant sub-cavity, and a second temperature control system for adjusting the temperature of the second etalon is arranged on the second etalon;

a radio frequency signal source used for providing radio frequency energy for the tunable acousto-optic filter and adjusting the oscillation wavelength of the laser resonant cavity by changing RF frequency;

a laser pumping source, an active optical phasemodulator drive source, an active polarization rotator drive source and a laser drive control circuit.

Further, the first temperature control system comprising a small thermoelectric cooler directly attached on the first etalon, a drive circuit, a temperature sensor, a control circuit, and a closed-loop control circuit; the second temperature control system composing a small thermoelectric cooler directly attached on the second etalon, a drive circuit, a temperature sensor, a control circuit, and a closed-loop control circuit.

Further, the first etalon and the second etalon have the same finesse; the first etalon and the second etalon have the same spectrum range as the laser gain medium, both the free spectrum range of the first etalon and the second etalon are 50 GHz with 25 GHz difference between the first and second etalon in the transmission spectrum peak frequency.

Further, the first total reflection mirror, the second total reflection mirror and the intracavity total reflection mirror are one of the following types of reflection mirrors: plane mirror, convex mirror and concave mirror; and the first total reflection mirror, the second total reflection mirror and the intracavity total reflection mirror have the same spectrum range as the laser gain medium.

Further, the laser cavity end mirror is a total reflection mirror or a partial reflection mirror within a specified spectrum range, and has the same spectrum range as the laser gain medium.

Further, the tunable acousto-optic filter includes a single acousto-optic crystal and a single acoustic wave transducer.

Further, the tunable acousto-optic filter is a narrow band optical filter with FWHM that is not more than twice the transmission spectrum peak frequency of the first etalon or the second etalon and has the same spectrum range as the laser gain medium.

Further, the active optical phasemodulator is one of the following types: electro-optic phase modulator, or magneto-optic phase modulator, or liquid crystal phase modulator, or acousto-optic phase modulator, or phase modulators based on other forms of physical optical effect, or a combination of the aforementioned phase modulators, and the active optical phase modulator has the same spectrum range as the laser gain medium.

Further, the active polarization rotator is one of the following types: electro-optic active polarization rotator, or magneto-optic active polarization rotator, or liquid crystal active polarization rotator, or acousto-optic active polarization rotator, or active polarization rotators based on other forms of physical optical effect, or a combination of the aforementioned active polarization rotators, and the active polarization rotator has the same spectrum range as the laser gain medium.

Further, the laser drive control circuit includes: a digital signal processor, four digital-to-analog conversion modules, the digital signal processor is used for receiving an external instructions signal for controlling the laser pumping source, the active optical phase modulator drive source, the tunable acousto-optic filter drive source, the active polarization rotator drive source, the first temperature control system and the second temperature control system, the temperature control function for the first etalon and the second etalon.

The invention has the following advantages and positive effects:

In the invention, a narrow band tunable acousto-optic filter with optical frequency shift compensation, an active polarization rotator, a polarization beam splitter, two etalons both having a free spectrum range of 50 GHz and two total reflection mirrors are used to form two laser resonant sub-cavities to achieve stable laser output. The optical frequency tuning precision is smaller than 1 GHz within a wide spectrum range can be realized based upon the temperature-based frequency shift of the transmission spectrum peak of the etalons. The requirement on the filtering bandwidth of the tunable acousto-optic filter is reduced, fast tuning with 25 GHz frequency interval is achieved by the tunable acousto-optic filter, which is suitable for output with 50 GHz frequency interval, and the etalons having a free spectrum range of 50 GHz. Thus, the requirement on the transmission spectrum peak frequency interval density of the etalons is reduced, and the difficulty in manufacturing the tunable acousto-optic filter and the etalons are also significantly reduced. Moreover, the optical frequency tuning range by the temperature-based frequency shift of the transmission spectrum peak of the etalons is reduced to 25 GHz. As a result, the tuning speed is greatly increased. The invention provides a method to build a laser with no mechanical movement component, stable and reliable performance, low cost, compact size and easy installation and production, and can meet the requirement for small size and reliable operation under an extreme working environment. Furthermore, the invention can also be widely used in optical test, fiber optical communication, biology, medical instrument, fiber sensor network and other fields.

Further detailed description is made below to the embodiments of the invention with reference to the drawings.

FIG. 1 illustrates a conventional tunable acousto-optic filter 100. The tunable acousto-optic filter 100 comprises a transducer 22, a radio frequency signal source 20 and an acousto-optic crystal 26, the transducer 20 is bonded to the acousto-optic crystal. An incident light beam 2 enters the acousto-optic crystal 26 at Bragg angle to generate a zero-order diffraction light beam 4 and a first-order diffraction light beam 6.

Figures 1, 3:
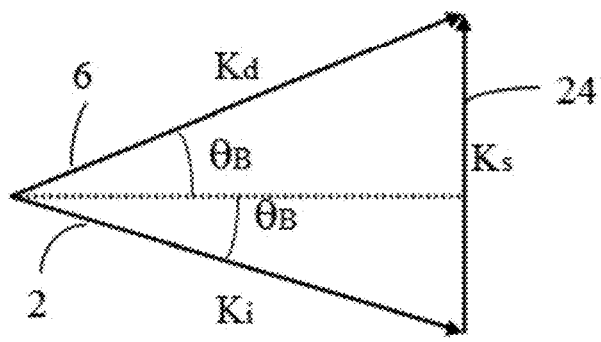
Figures 2, 3:
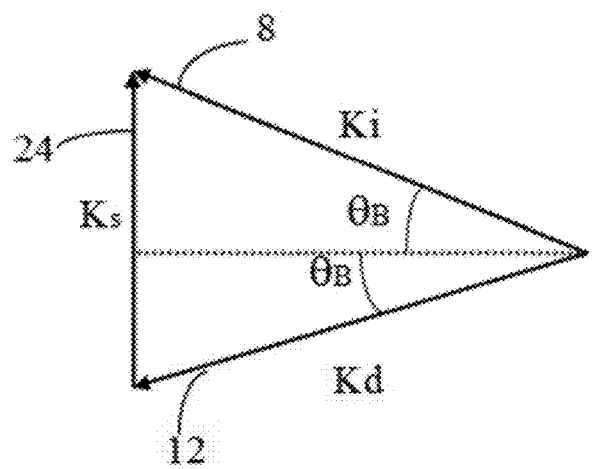

The principle of the acousto-optic filter is based upon a phenomenon known as Bragg diffraction that involves the interaction process of photons (light energy's quanta) and phonons (acoustic energy's quanta). Both energy and momentum are conserved in this interaction process. $\hbar k_d = \hbar k_i + \hbar k_s$ is required in momentum conservation, wherein $\hbar k_d$ is the momentum of diffraction photon, $\hbar K_i$ is the momentum of incident photon and $\hbar k_s$ is the momentum of interactive phonon. The formula below is obtained after $\hbar$ is removed: $K_d = K_i + K_s$, which is the fundamental wave vector equation in Bragg diffraction and means that diffracted light wave vector is the vector sum of the incident light wave vector and the acoustic wave vector, as shown in FIG. 3-1. The relation of ($\hbar \omega_i = \hbar \omega + \hbar \Omega$) is required in energy conservation, wherein $\omega_r$ is the angular frequency of diffraction light, ω is the angular frequency of incident light and Ψ is the angular frequency of acoustic wave. The formula below is obtained after $\hbar$ is removed: $\omega_r=\omega+\Omega$. This means that the angular frequency of diffraction photon is slightly altered by the angular frequency of acoustic wave, or so called Doppler frequency shift. Acousto-optic Tunable Filter (AOTF) 100 is a solid-state bandpass optical filter that can be tuned by electric signal. Compared with the traditional techniques, AOTF provides continuous and fast tuning capability with narrow spectrum bandwidth. Acousto-optic filters can be divided in two categories: collinear and non-collinear. Narrow-band filtering can be realized by a non-collinear and far off-axis type filter. From the formula $\omega_r=\omega+\Omega$, it is known that the magnitude of the frequency shift of light wave is equal to the frequency of acoustic wave.

While Doppler frequency shift in AOTF is small because acoustic wave frequency is of many orders of magnitude smaller compared with the light wave frequency, unstable operation can still arise in some laser systems. A solution to this problem is the use of two AOTFs in which the second AOTF is used for offsetting the frequency shift caused by the first AOTF. Another solution is the use of two transducers on a single acousto-optic crystal. But these solutions have a few shortcomings such as: 1), the increase of system size and electric power consumption, 2), more difficult for optical alignment, 3), unstable operation, and 4), cost increase, which is especially important for mass production.

Figure 2:
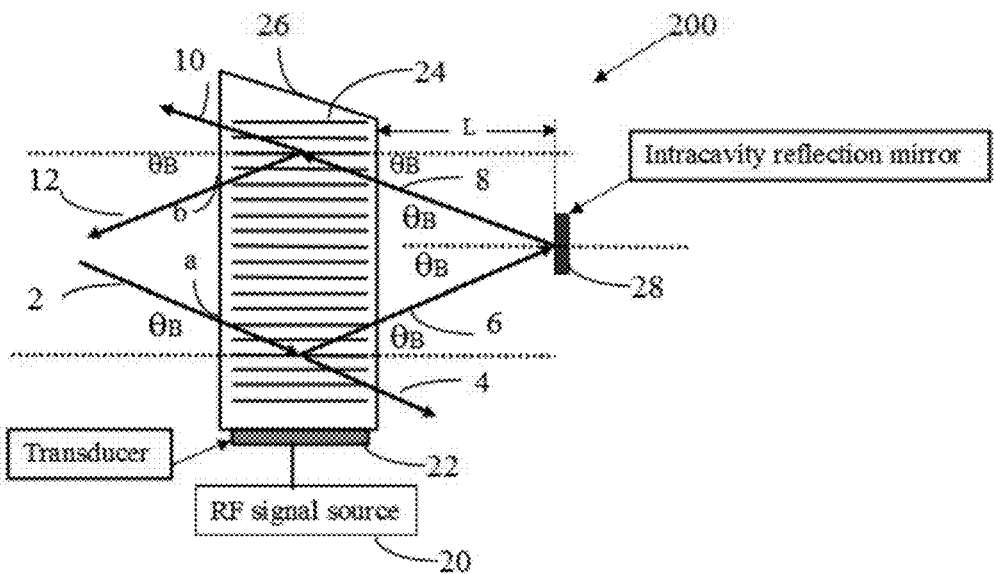
FIG. 2 is a schematic diagram of an existing tunable acousto-optic filter with frequency shift compensation.

FIG. 2 illustrates a tunable acousto-optic filter 200 capable of eliminating frequency shift effectively. The tunable acousto-optic filter 200 comprises a transducer 22, an acousto-optic crystal 26, a radio frequency signal source 20 and a total reflection mirror 28, an incident light beam 2 enters the acousto-optic crystal 26 at Bragg angle to generate a zero-order diffracted light beam 4 and a first-order diffracted light beam 6, which is diffracted again by acousto-optic crystal 26 into a zero-order diffracted light beam 10 and a first-order diffracted light beam 12 after being reflected by the total reflection mirror 28. FIG. 3-1 and FIG. 3-2 illustrate the wave vector relation among incident light ($K_i$), diffraction light ($K_d$) and acoustic wave ($K_s$). As mentioned above, the relation $K_i \pm K_s = K_d$ is always true, whether plus sign (+) or minus sign (−) is used is determined by the direction of incident acoustic wave with respect to that of the acoustic waves, in FIG. 3-1, light 2 ($K_2$), light 6 ($K_6$) and acoustic wave 24 ($K_s$) have such a relation that: $K_2+K_s=K_4$. The acoustic wave $K_s$ leads to not only upward shift of the diffracted light, but also upward shift of the angular frequency ω of the light by $\Omega=v_s|K_s|$, wherein $v_s$ is the velocity of acoustic wave. In FIG. 3-2, light 8 ($K_8$), light 12 ($K_{12}$) and acoustic wave 24 ($K_s$) have such a relation that: $K_s-K_s=K_{12}$. In this case, acoustic wave leads to downward shift and also downward shift of the angular frequency ω of the light 12 diffracted by $v_s|K_s|$. The upward and downward shifts are basically the same, so the overall frequency shift is fully eliminated when the light 12 exits from the acousto-optic filter 200.

In some embodiments, for example, when narrow-band tuning is needed, an anisotropic and birefringent acousto-optic crystal is used. One of the crystals is tellurium dioxide ($TeO_2$), which is widely used in such applications because it has high optical uniformity, low light absorbance and high damage threshold to optical power when operating under a shear mode. Other crystals such as lithium niobate ($LiNbO_3$), gallium phosphide (GaP) and lead molybdate ($PbMoO_4$) are also frequently used in a variety of acousto-optic sources. There are several factors that influence the choice of a particular crystal such as the type of acousto-optic source, whether high-quality crystal is easily available and the requirements of a particular application, such as diffraction efficiency, power loss, degree of dispersion of the incident light and the diffracted light and overall source size, etc.

Figure 4:
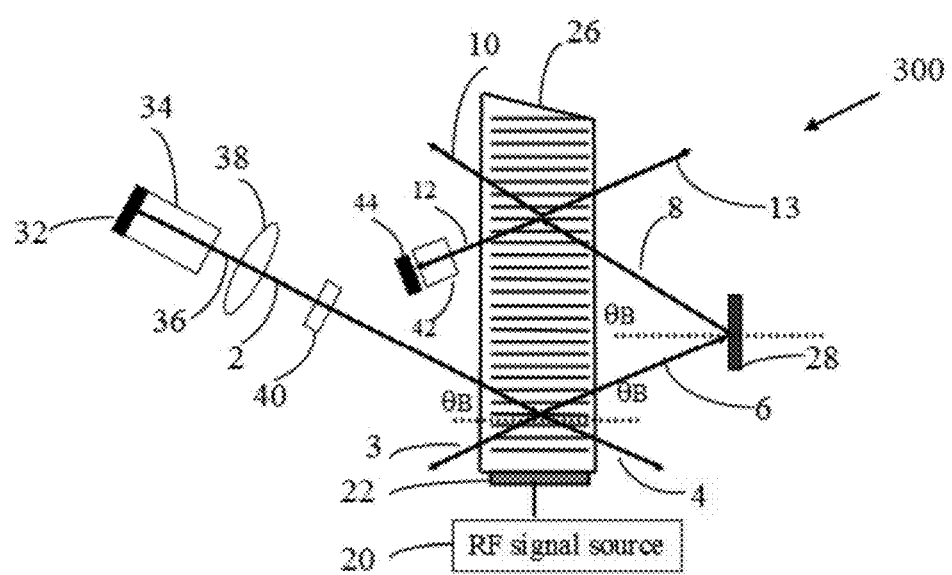
FIG. 4 is a schematic drawing of an external cavity tunable laser using a tunable acousto-optic filter and a single etalon.

FIG. 4 illustrates an external cavity tunable laser 300 using a tunable acousto-optic filter as shown in FIG. 2 and a single etalon. The tunable laser 300 comprises a laser cavity end mirror 32 directly plated on a laser gain medium 34, the laser gain medium 34, an intracavity collimating lens 36, an active optical phase modulator 40, a tunable acousto-optic filter 100, an intracavity total reflection mirror 28, an etalon 42 and a total reflection mirror 44, wherein the laser cavity end mirror 32 and the total reflection mirror 44 form a laser resonant cavity.

Laser output mirror differs in reflectivity for light with different frequencies or colors, and the reflectivity mentioned herein means a reflectivity corresponding to the frequency bandwidth of an operating laser. The laser cavity end mirror 32 can be either a partial reflection mirror or a total reflection mirror according to different situations. When the laser gain medium is a semiconductor gain medium that has a relatively large output divergent angle, the intracavity collimating lens of the tunable laser 300 is normally used. When the laser gain medium is gas, liquid or some solid media, the intracavity collimating lens is not often used, instead, a non-planar cavity mirror is used to realize a reasonable distribution of intracavity light beams. When such lasers are used for fiber optical communication, an output light beam 4 needs to be coupled to an optical fiber, so the collimating lens 38 is indispensable.

In the tunable laser 300, a wideband light beam 36 emitted from the laser gain medium 34 is collimated by the intracavity collimating lens 38 to form a light beam 2, the light beam 2 enters the acousto-optic crystal 26 at Bragg angle in the opposite direction of the acoustic waves inside the acousto-optic crystal 26 through the active optical phase modulator 40, a first-order diffracted light beam 6 enters the intracavity total reflection mirror 28 at Bragg angle which has an optical reflection surface aligned parallel to the propagation direction of the acoustic wave inside the acousto-optic crystal 26, and the reflected light beam 8 by the total reflection mirror 28 enters the acousto-optic crystal 26 at Bragg angle. A first-order diffracted light beam 12 of the second diffraction by the acousto-optic crystal 26 passes through the etalon 42 and is then reflected back into a laser cavity by the total reflection mirror 44, thus creating laser oscillation and amplification inside the laser cavity. During this process, light beams 4 and 10 are the zero-order diffracted light beams of the light beams 2 and 8 respectively inside the laser cavity; a light beam 13 is the zero-order diffracted light beam of the light beam 12, which leaks out of the laser cavity and becomes the loss of the laser cavity. The light beam 4 is selected as a laser output light beam due to its higher power compared with other light beams and zero optical frequency shift. Light beams 10 and 13 can be used for monitoring the optical power and frequency inside the laser cavity.

As previously analyzed, optical frequency shifts generated by the first diffraction and the second diffraction are equal, but opposite to each other, so the overall optical frequency shift caused by the tunable acousto-optic filter 100 inside tunable laser 300 is zero. Laser oscillation bandwidth that is narrower than first diffraction is formed in the laser cavity due to the second diffraction by the tunable acousto-optic filter 100.

Laser output tuning is achieved by the active optical phase modulator 40 and the tunable acousto-optic filter 100. The light wave resonant frequency in the laser cavity can be changed by changing the RF frequency of the radio frequency signal source 20 for the tunable acousto-optic filter 100. In accordance with different light wave resonant frequencies, the active optical phase modulator 40 enables a particular light wave to form laser oscillation and amplification in the laser cavity by regulating the phase of the light wave to meet the lasing oscillation conditions in the laser cavity.

The interval and bandwidth of laser output spectrum are determined by the etalon 42. The use of an etalon with a high finesse can compress the spectrum bandwidth of output light beam and increase the side mode suppression ratio. If the interval of laser output spectrum needs to be reduced, both the filtering bandwidth of the tunable acousto-optic filter 100 and the interval of the transmission spectrum peak frequencies of the etalon 42 need to be reduced at the same time in order to establish a stable lasing operation inside laser cavity. In this way, the phenomenon of laser cavity mode hopping is avoided and single-mode oscillation of the laser is guaranteed. If the interval of laser output spectrum needs to be 25 GHz, the spectrum interval of the etalon 42 needs to be 25 GHz, and it is also required that the FWHM (Full Width Half Maximum) of the filtering bandwidth of the tunable acousto-optic filter 100 is at least less than 50 GHz. This significantly increases the technical difficulty and manufacturing cost of the tunable acousto-optic filter 100. The technical difficulty and manufacturing cost of the etalon are also increased. In the case that the laser gain medium is a homogeneous gain medium, it is generally required that the FWHM of the filtering bandwidth of the tunable acousto-optic filter is less than 2Δf (assuming that the transmission bandwidth of the etalon is Δf). If the filtering bandwidth of the tunable acousto-optic filter is more than 2Δf, multi-mode oscillation may occur to result in multi-mode output or mode hopping. If the laser gain medium is a non-homogeneous gain medium, it is required that the FWHM of the filtering bandwidth of the tunable acousto-optic filter should be even narrower.

Figure 5:
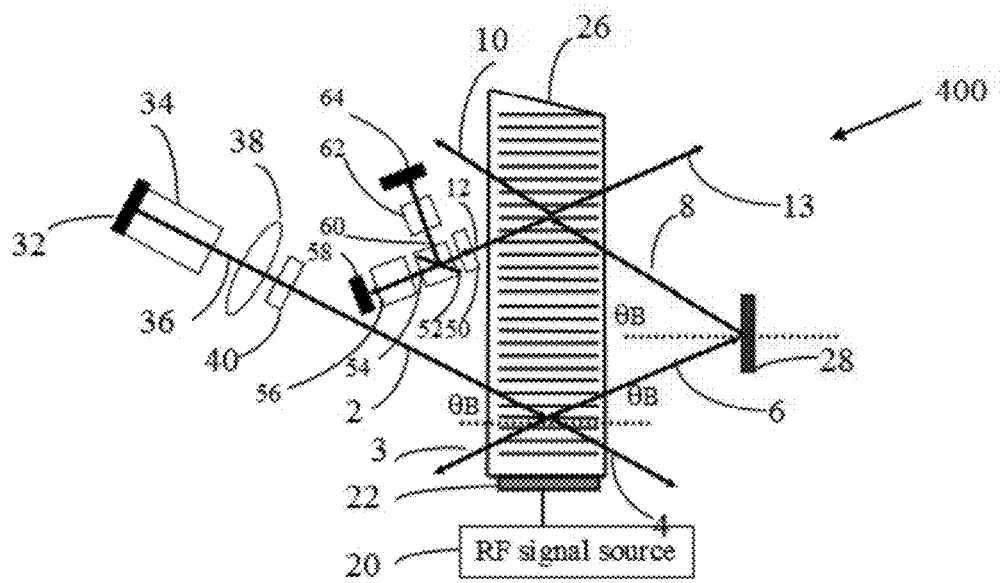
FIG. 5 is a schematic drawing of an external cavity tunable laser using two etalons, an active polarization rotator and a polarized light beam splitting mirror.

The external cavity tunable laser 400 shown in FIG. 5 provides a method to solve the aforementioned problems. The external cavity tunable laser 400 includes a laser cavity end mirror 32 directly plated on a laser gain medium 34, a laser gain medium 34, an intracavity collimating lens 38, an active optical phasemodulator 40, a tunable acousto-optic filter 100, an intracavity total reflection mirror 28, an active polarization rotator 50 a polarization beam splitter 52, a first etalon 62, a first total reflection mirror 64, a second etalon 56, a second total reflection mirror 58 and a laser drive control circuit.

Figure 6:
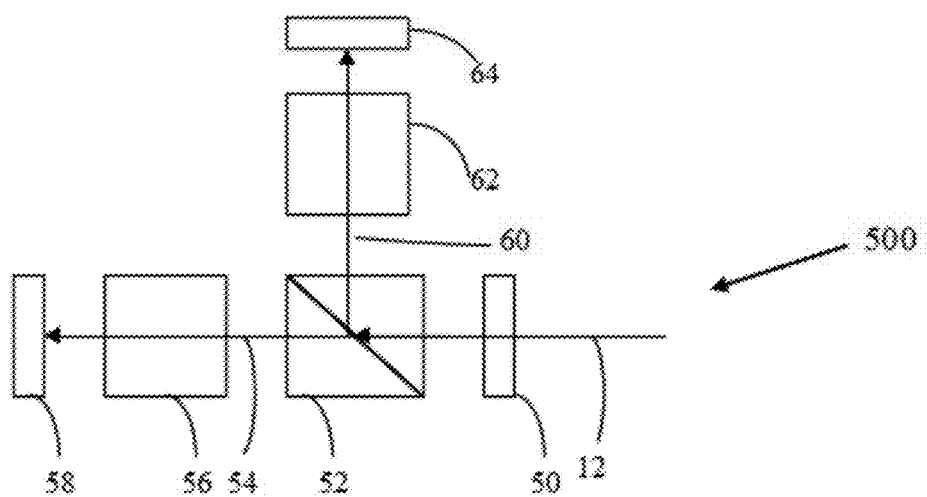
FIG. 6 is a schematic diagram of a device for laser resonant mode switching by an active polarization rotator and a polarized light beam splitting mirror.
Figure 7:
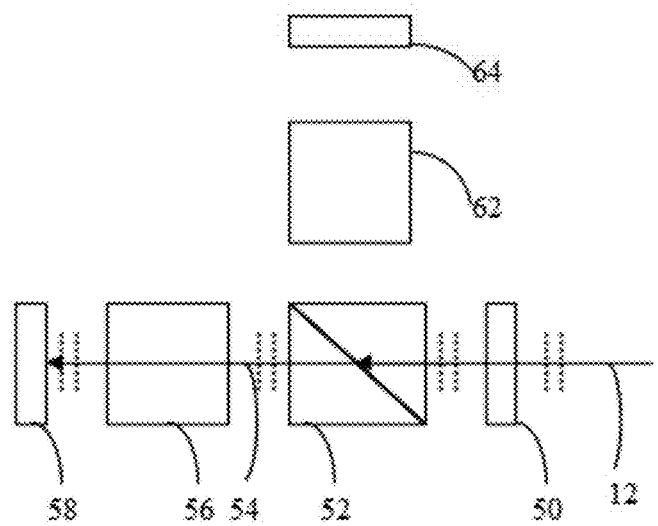
FIG. 7 is a schematic diagram illustrating the transmission path of parallel polarized light in the device depicted in FIG. 6.
Figure 8:
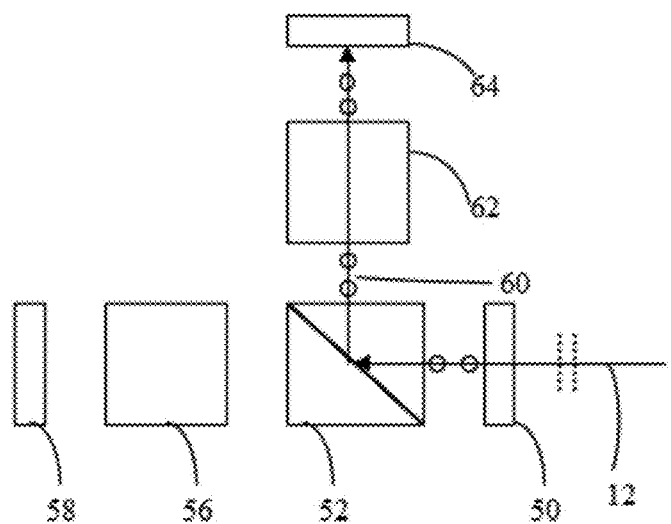
FIG. 8 is a schematic diagram illustrating the transmission path of vertically polarized light in the device depicted in FIG. 6.
Figures 1, 9:
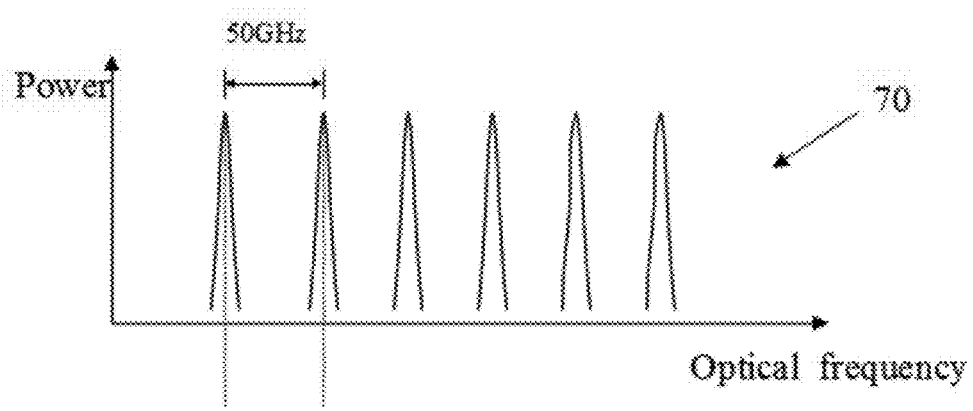
Figures 2, 9:
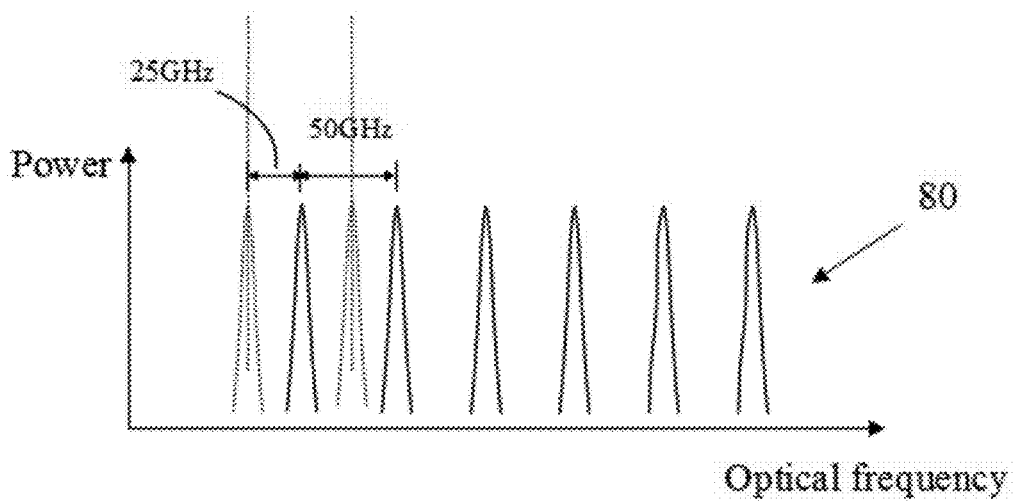
Figure 10:
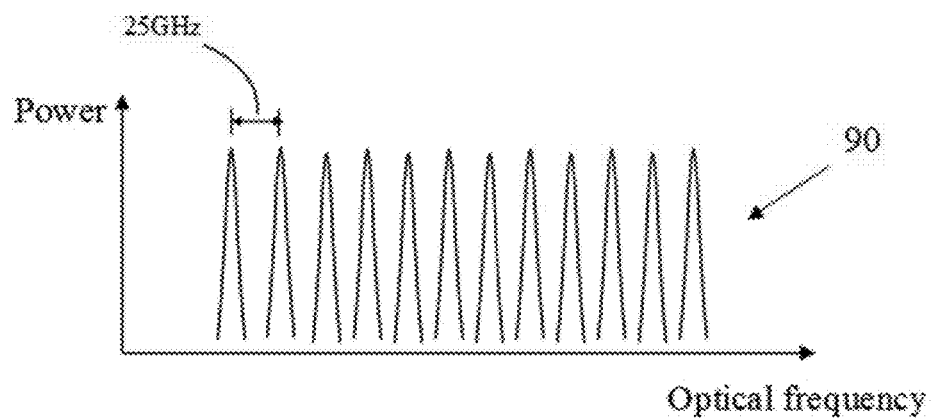
FIG. 10 is a schematic diagram of the output spectrum of the tunable laser with 25 GHz transmission spectrum interval.

The active polarization rotator 50 is arranged on the opposite side of the tunable acousto-optic filter 100 from the total reflection mirror 28 for rotating the polarization direction of linearly polarized incident light 12 by 90 degrees, the polarization beam splitter 52 is arranged behind the active polarization rotator 50 for total transmission of parallel polarized incident light and for reflecting vertically polarized incident light into a direction having an angle of 90 degrees with respect to the incident light; the first etalon 62 is arranged in a direction vertical to the light 12 inside the laser cavity and is used for receiving the vertically polarized light 60 output by the polarization beam splitter 52 and outputting the vertically polarized light to the first total reflection mirror 64, the first total reflection mirror 64 and the laser cavity end mirror 32 form a first laser resonant sub-cavity. The second etalon 56 is arranged in a direction of the light 12 inside the laser cavity and used for receiving the parallel polarized light output by the polarization beam splitter 52 and outputting the parallel polarized light to the second total reflection mirror 58. The second total reflection mirror 58 and the laser cavity end mirror 32 form a second laser resonant sub-cavity. The difference between the tunable laser 400 and the tunable laser 300 is that: the etalon 34 and the total reflection mirror 36 in the tunable laser 300 (FIG. 4) are replaced by a dual-light path system 500 consisting of an active polarization rotator 50, a polarization beam splitter 52, a first etalon 62, a first total reflection mirror 64, a second etalon 56 and a second total reflection mirror 58, as shown in FIG. 6. The active polarization rotator 50 is capable of changing the polarization direction of the incident light 12: when the active polarization rotator does not work, the incident light 12 directly passes through the polarization beam splitter 52, then arrives at the second total reflection mirror 58 through the second etalon 56, and is finally reflected back into the laser cavity through the second total reflection mirror 58, as shown in FIG. 7. When the active polarization rotator is activated, the incident light 12 is turned into vertically polarized light after the polarization state is rotated by 90 degrees, the vertically polarized light is reflected by the polarization beam splitter 54, then arrives at the second total reflection mirror 64 through the first etalon 62 and is finally reflected back into the laser cavity through the second total reflection mirror 64, as shown in FIG. 8. The light reflected back by the second total reflection mirror 64 passes through the active polarization rotator 50 again and the polarization state is rotated by 90 degrees once again. As a result, the polarization direction of the output light beam of the laser is not changed. Therefore, the laser resonant sub-cavities can be formed in the tunable laser 400 by controlling the active polarization rotator 50: the first laser sub-cavity is composing the laser cavity end mirror 32 and the first total reflection mirror 64, while the second laser sub-cavity comprising the laser cavity end mirror 32 and the second total reflection mirror 58. FIG. 9-1 and FIG. 9-2 illustrate the transmission spectra of the first etalon 62 and the second etalon 56 respectively. The two etalons 56 and 62 have the same free spectrum range of 50 GHz and finesse with 25 GHz difference in their transmission spectrum peaks. In this manner, the output spectrum of the tunable laser 400 is an integration of the output of two laser sub-cavities, that is to say, tunable laser output with 25 GHz spectrum peak interval and consistent polarization states can be realized, as shown in FIG. 10.

In the external cavity tunable laser 400, the first etalon 62 and the second etalon 56 have the same finesse. Furthermore, the first etalon 62 and the second etalon 56 have the spectrum range as the laser gain medium, both the first etalon 62 and the second etalon 56 have a free spectrum range of 50 GHz with 25 GHz difference in the transmission spectrum peak frequency. For the tunable lasers used in fiber communication, the transmission spectrum peak of the first etalon 62 and second etalon 56 should meet the international optical communication standards (ITU-GRID). As for other applications, the transmission spectrum peak of the first etalon 62 and second etalon 56 can be different based upon a specific application design. With the structure of the tunable laser 400, tunable output with smaller spectrum frequency interval can be realized only if the FWHM value of the filtering bandwidth of the tunable acousto-optic filter is less than 2Δf (assuming that the transmission bandwidth of the etalon is Δf). For example, if the free spectrum ranges of the first etalon 62 and the second etalon 56 is 25 GHz, with 12.5 GHz difference in their transmission spectrum peak frequency, the tunable laser 400 can provide a stable tunable output with 12.5 GHz spectrum frequency interval when the FWHM value of the filtering bandwidth of the tunable acousto-optic filter is less than 50 GHz.

In general, fluorescent light output by a semiconductor laser gain medium is linearly polarized light. For such laser gain media, a polarizer is not needed in the cavity. As for other laser gain media that output nonlinearly polarized light, a polarizer is indispensable for the tunable laser 400 to implement the above functions.

With the development of optical communication technology, DWDM optical communication network has been developed towards 25 GHz and even higher optical channel density. This requires a tunable acousto-optic filter with narrower filtering bandwidth, which increases the difficulty in manufacturing such a tunable acousto-optic filter, hence the cost to build a laser using such a tunable acousto-optic filter. As for some other applications of such a tunable laser, the increase of the laser tunable spectrum density will increase the cost and technical difficulty. The tunable laser 400, on the basis of the existing external cavity laser with 50 GHz frequency interval, can provide a novel method capable of achieving tunable output with 25 GHz frequency interval or even smaller spectrum interval, and the cost and manufacturing difficulty are not increased significantly.

The shift of the transmission spectrum peak of the etalons by temperature change can be used for precision tuning within a wide frequency bandwidth with narrow bandwidth output. The temperature control systems on the etalon 56 and 62 can control the temperatures on the two etalon, and therefore, control the transmission spectrum peak of the etalons. The requirement on the filtering bandwidth of the tunable acousto-optic filter to achieve such tuning functionality is reduced.

Fast tuning with 25 GHz frequency interval is achieved by the tunable acousto-optic filter, which is suitable for tuning by 50 GHz frequency interval with etalons having a free spectrum range of 50 GHz. Therefore, the requirement on the transmission spectrum peak frequency interval density of the etalons is reduced, thus the difficulty in manufacturing the tunable acousto-optic filter and the etalons is dramatically reduced; moreover, the optical frequency tuning range by the temperature-based shift characteristic of the transmission spectrum peak of the etalons is utilized is reduced to 25 GHz. As a result, the tuning speed is greatly increased.

Figure 11:
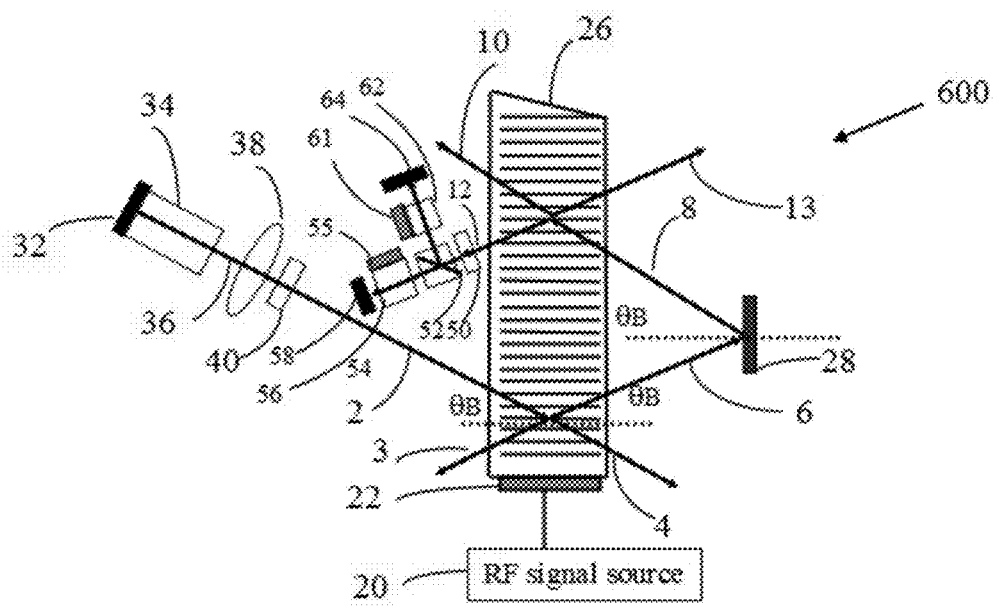
FIG. 11 is a schematic drawing of the invention.
Figure 12:
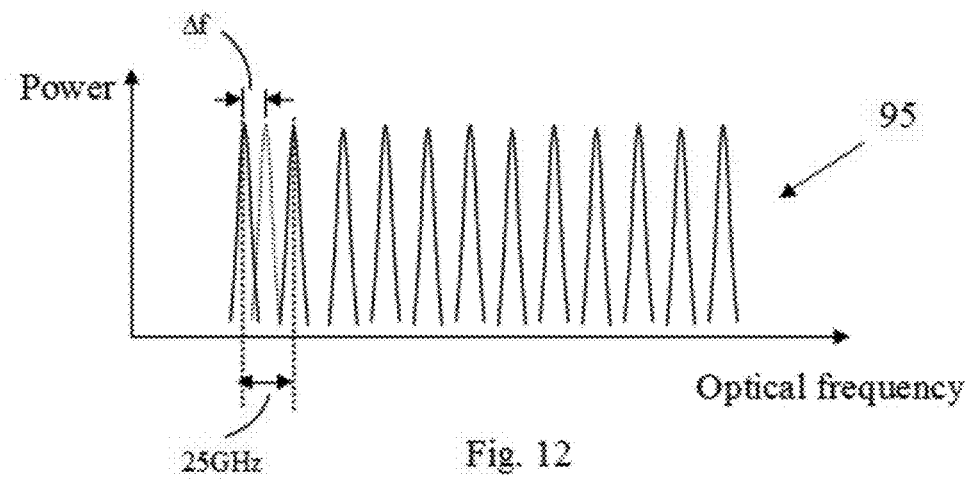
FIG. 12 is a schematic diagram of the output spectrum of the tunable laser with optical frequency tuning by means of temperature change.

FIG. 11 is a schematic drawing of the invention. The precision frequency tuning is realized in the invention is based on the temperature effects of the etalons in the external cavity tunable laser 400 as shown in FIG. 5. A first temperature control system 61 and a second temperature control system 55 are arranged on the first etalon 62 and the second etalon 56 respectively for the precision optical frequency tunable laser 600. The precision optical frequency tunable laser 600, on the basis of coarse tuning by the external cavity tunable laser 400, is capable of tuning with high frequency precision based upon the temperature-based shift characteristic of the transmission spectrum peak of the first etalon 62 and the second etalon 56. As shown in FIG. 12, the temperature ranges that need to be controlled is greatly decreased because the precision tuning range is limited to 25 GHz and the tuning speed can be increased. If the transmission spectrum temperature shift coefficients of the etalons 62 and 56 are 1 GHz/° C., the total temperature control range for realizing tuning within 25 GHz spectrum range is 25° C. The tuning precision also depends on the control precision of the temperature control systems 61 and 55 for the temperature of the first etalon 62 and the second etalon 56. For example, if the control precision is 0.5° C., the optical frequency tuning precision of the precision optical frequency tunable laser 600 can reach 0.5 GHz.

The optical frequency tuning precision and stability further depend on other factors: such as structural stability of laser cavity, influence from external environment temperature and the like. In general, the optical resonant cavity of a laser should be designed to eliminate or minimize the influence from external temperature and other factors that affect the laser's long-term working stability. Both the output stability and the tuning precision of the precision optical frequency tunable laser 600 can be realized when the temperature control systems 61 and 55 can effectively and precisely control the temperature of the first etalon 62 and the second etalon 56 respectively.

Figure 13:
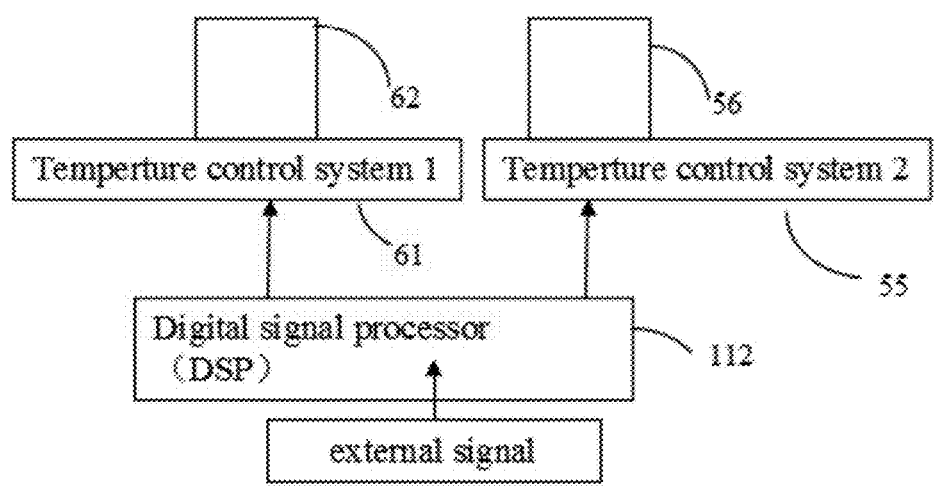
FIG. 13 is a control schematic diagram of the temperature control systems attached to the two etalons.
Figure 14:
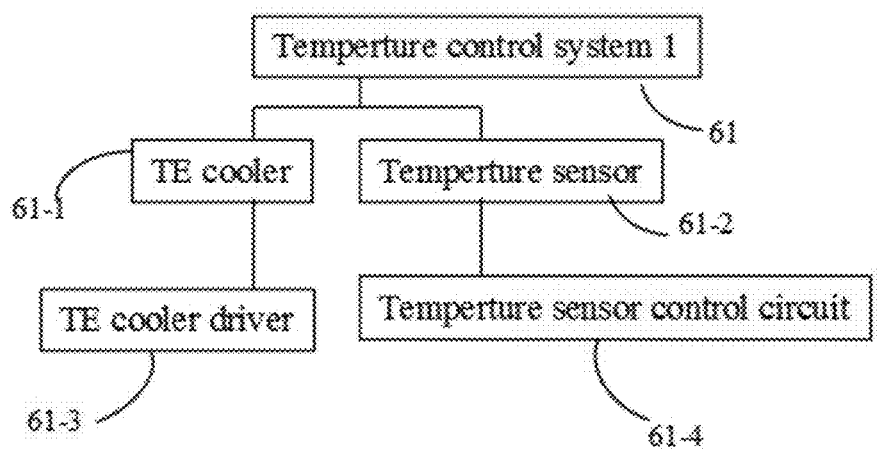
FIG. 14 is a schematic diagram of the control structure of the first temperature control system.
Figure 15:
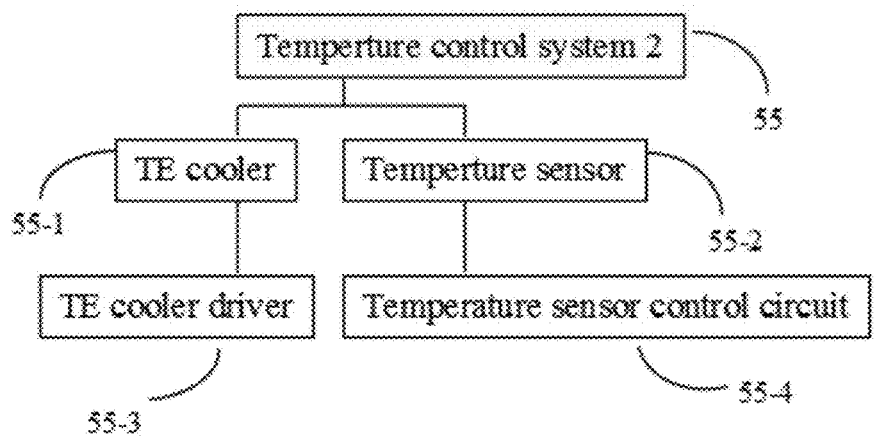
FIG. 15 is a schematic diagram of the control structure of the second temperature control system.

The first temperature control system 61 and the second temperature control system 55 control the temperatures for the first etalon 62 and the second etalon 56 respectively. As shown in FIG. 13, the first temperature control system 61 and the second temperature control system 55 are controlled by the same digital signal processor (DSP) 112. The first temperature control system 61 includes a thermoelectric cooler (TEC) 61-1 and a drive circuit 61-3 and a temperature sensor 61-2 and a control circuit 61-4; the second temperature control system 55 includes a thermoelectric cooler (TEC) 55-1 and a drive circuit 55-3 and a temperature sensor 55-2 and a control circuit 55-4, as shown in FIG. 14 and FIG. 15 respectively.

Figure 16:
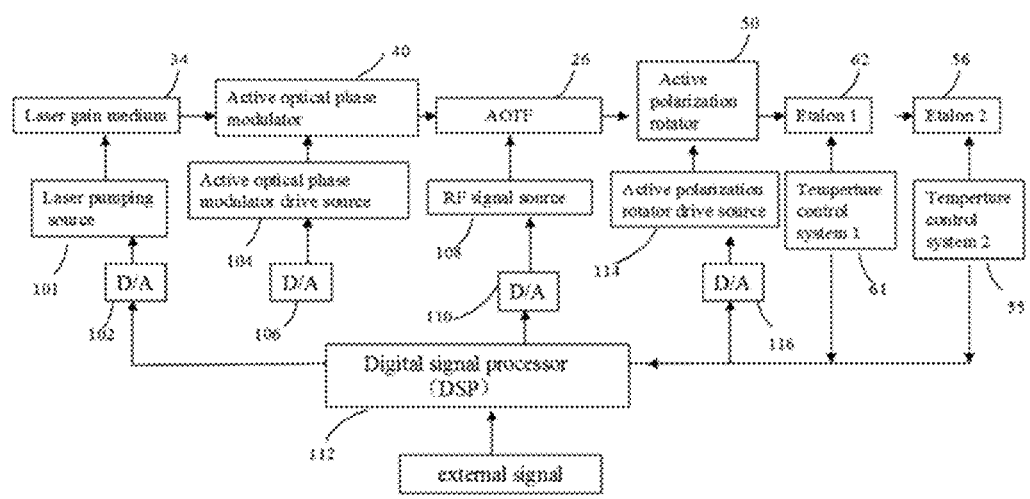
FIG. 16 is a functional block diagram of the laser drive control circuit.

The laser drive control circuit of the precision optical frequency tunable laser 600 is as shown in FIG. 16. The laser drive control circuit includes a digital signal processor (DSP) 112 with embedded software programs and four digital-to-analog conversion (D/A) devices 102, 106, 110 and 116. The digital signal processor (DSP) 112 with embedded software programs is used for controlling the laser pumping source 101, the active optical phasemodulator drive source 104, the radio frequency signal source 108, the active polarization rotator drive source 114, the first temperature control system 61 and the second temperature control system 55 respectively through the digital-to-analog conversion (D/A) devices 102, 106, 110 and 116. The digital signal processor 112 may also receive an external instruction to control the tunable laser 600.

The above description is for demonstration and description only, not a detailed one without omission, and is not intended to limit the invention within the described specific forms. With the aforementioned description, many modifications and variations to the invention are possible. The chosen embodiments are merely for better explanation of the principle and practical applications of the invention. This description enables people familiar with this art to make better use of the invention, and to design different embodiments based on the actual needs and implement corresponding modifications.

What is claimed is:

1. A precision optical frequency tunable laser comprising a laser gain medium, a laser cavity end mirror arranged on the laser gain medium, an intracavity collimating lens, an active optical phase modulator, a tunable acousto-optic filter and an intracavity total reflection mirror all arranged sequentially inside the laser cavity and in such a way that the light beam emitted from the laser gain medium can be diffracted twice by the tunable acousto-optic filter and a frequency shift introduced by the diffractions can be compensated, the laser further comprises:

an active polarization rotator for controlling a polarization direction of linearly polarized incident light, the active polarization rotator is arranged on the opposite side of the tunable acousto-optic filter from the intracavity total reflection mirror to receive the diffracted light beam by the tunable acousto-optic filter;

a polarization beam splitter arranged behind the active polarization rotator for total transmission of parallel polarized incident light and for reflecting vertically polarized incident light into a direction having an angle of 90 degrees with respect to the incident light;

a first etalon and a first total reflection mirror, which are arranged in a direction vertical to the optic axis of the diffracted light beam by the tunable acousto-optic filter and used for receiving the vertically polarized light output by the polarization beam splitter and outputting the vertically polarized light to the first total reflection mirror, the first total reflection mirror and the laser cavity end mirror forming a first laser resonant sub-cavity, and a first temperature control system for adjusting the temperature of the first etalon is arranged on the first etalon;

a second etalon and a second total reflection mirror, which are arranged in a direction parallel to the optic axis of the diffracted light beam by the tunable acousto-optic filter and used for receiving the parallel polarized light output by the polarization beam splitter and outputting the parallel polarized light to the second total reflection mirror, the second total reflection mirror and the laser cavity end mirror forming a second laser resonant sub-cavity, and a second temperature control system for adjusting the temperature of the second etalon is arranged on the second etalon;

a radio frequency signal source used for providing radio frequency energy for the tunable acousto-optic filter and adjusting the oscillation wavelength of the laser resonant cavity by changing RF frequency; and a laser pumping source, an active optical phasemodulator drive source, an active polarization rotator drive source and a laser drive control circuit.

2. The precision optical frequency tunable laser of claim 1, wherein the first temperature control system comprising a small thermoelectric cooler directly attached on the first etalon, a drive circuit, a temperature sensor, a control circuit, and a closed-loop control circuit, the second temperature control system composing a small thermoelectric cooler directly attached on the second etalon, a drive circuit, a temperature sensor, a control circuit, and a closed-loop control circuit.

3. The precision optical frequency tunable laser of claim 1, wherein the first etalon and the second etalon have the same finesse; the first etalon and the second etalon have the same spectrum range as the laser gain medium, both the free spectrum range of the first etalon and the second etalon are 50 GHz with 25 GHz difference between the first and second etalon in the transmission spectrum peak frequency.

4. The precision optical frequency tunable laser of claim 2, wherein the first etalon and the second etalon have the same finesse; the first etalon and the second etalon have the same, spectrum range as the laser gain medium, both the free spectrum range of the first etalon and the second etalon are 50 GHz with 25 GHz difference between the first and second etalon in the transmission spectrum peak frequency.

5. The precision optical frequency tunable laser of claim 1, wherein the first total reflection mirror, the second total reflection mirror and the intracavity total reflection mirror are one of the following types of reflection mirrors: plane mirror, convex mirror and concave mirror; and the first total reflection mirror, the second total reflection mirror and the intracavity total reflection mirror have the same spectrum range as the laser gain medium.

6. The precision optical frequency tunable laser of claim 2, wherein the first total reflection mirror, the second total reflection mirror and the intracavity total reflection mirror are one of the following types of reflection mirrors: plane mirror, convex mirror and concave mirror; and the first total reflection mirror, the second total reflection mirror and the intracavity total reflection mirror have the same spectrum range as the laser gain medium.

7. The precision optical frequency tunable laser of claim 1, wherein the laser cavity end mirror is a total reflection mirror or a partial reflection mirror within a specified spectrum range, and has the same spectrum range as the laser gain medium.

8. The precision optical frequency tunable laser of claim 2, wherein the laser cavity end mirror is a total reflection mirror or a partial reflection mirror within a specified spectrum range, and has the same spectrum range as the laser gain medium.

9. The precision optical frequency tunable laser of claim 1, wherein the tunable acousto-optic filter includes a single acousto-optic crystal and a single acoustic wave transducer.

10. The precision optical frequency tunable laser of claim 1, wherein the tunable acousto-optic filter is a narrow band optical filter with FWHM that is not more than twice the transmission spectrum peak frequency of the first etalon or the second etalon and has the same spectrum range as the laser gain medium.

11. The precision optical frequency tunable laser of claim 2, wherein the tunable acousto-optic filter is a narrow band optical filter with FWHM that is not more than twice the transmission spectrum peak frequency of the first etalon or the second etalon and has the same spectrum range as the laser gain medium.

12. The precision optical frequency tunable laser of claim 9, wherein the tunable acousto-optic filter is a narrow band optical filter with FWHM that is not more than twice the transmission spectrum peak frequency of the first etalon or the second etalon and has the same spectrum range as the laser gain medium.

13. The precision optical frequency tunable laser of claim 1, wherein the active optical phasemodulator is one of the following types: electro-optic phase modulator, or magneto-optic phase modulator, or liquid crystal phase modulator, or acousto-optic phase modulator, or phase modulators based on other forms of physical optical effect, or a combination of the aforementioned phase modulators, and the active optical phase modulator has the same spectrum range as the laser gain medium.

14. The precision optical frequency tunable laser of claim 2, wherein the active optical phasemodulator is one of the following types: electro-optic phase modulator, or magneto-optic phase modulator, or liquid crystal phase modulator, or acousto-optic phase modulator, or phase modulators based on other forms of physical optical effect, or a combination of the aforementioned phase modulators, and the active optical phase modulator has the same spectrum range as the laser gain medium.

15. The precision optical frequency tunable laser of claim 1, wherein the active polarization rotator is one of the following types: electro-optic active polarization rotator, or magneto-optic active polarization rotator, or liquid crystal active polarization rotator, or acousto-optic active polarization rotator, or active polarization rotators based on other forms of physical optical effect, or a combination of the aforementioned active polarization rotators, and the active polarization rotator has the same spectrum range as the laser gain medium.

16. The precision optical frequency tunable laser of claim 2, wherein the active polarization rotator is one of the following types: electro-optic active polarization rotator, or magneto-optic active polarization rotator, or liquid crystal active polarization rotator, or acousto-optic active polarization rotator, or active polarization rotators based on other forms of physical optical effect, or a combination of the aforementioned active polarization rotators, and the active polarization rotator has the same spectrum range as the laser gain medium.

17. The precision optical frequency tunable laser of claim 1, wherein the laser drive control circuit includes: a digital signal processor, four digital-to-analog conversion modules, the digital signal processor is used for receiving an external instructions signal for controlling the laser pumping source, the active optical phase modulator drive source, the tunable acousto-optic filter drive source, the active polarization rotator drive source, the first temperature control system and the second temperature control system, the temperature control function for the first etalon and the second etalon.

18. The precision optical frequency tunable laser of claim 2, wherein the laser drive control circuit includes: a digital signal processor, four digital-to-analog conversion modules, the digital signal processor is used for receiving an external instructions signal for controlling the laser pumping source, the active optical phase modulator drive source, the tunable acousto-optic filter drive source, the active polarization rotator drive source, the first temperature control system and the second temperature control system, the temperature control function for the first etalon and the second etalon.

* * * * *